(12) United States Patent
Kuznetsov

(10) Patent No.: US 12,349,325 B2
(45) Date of Patent: Jul. 1, 2025

(54) TWO-PHASE LIQUID-COOLED ELECTRICAL POWER APPARATUS

(71) Applicant: Raytheon Company, Arlington, VA (US)

(72) Inventor: Stephen B. Kuznetsov, Marlboro, MA (US)

(73) Assignee: Raytheon Company, Arlington, VA (US)

( * ) Notice: Subject to any disclaimer, the term of this patent is extended or adjusted under 35 U.S.C. 154(b) by 163 days.

(21) Appl. No.: 17/885,400

(22) Filed: Aug. 10, 2022

(65) Prior Publication Data

US 2024/0057304 A1    Feb. 15, 2024

(51) Int. Cl.
*H05K 7/20*      (2006.01)
*H01F 27/18*      (2006.01)
*H01L 23/427*      (2006.01)

(52) U.S. Cl.
CPC ......... *H05K 7/20936* (2013.01); *H01F 27/18* (2013.01); *H01L 23/427* (2013.01);
(Continued)

(58) Field of Classification Search
CPC ........... H05K 7/20936; H05K 7/20309; H05K 7/20318; H05K 7/20327; H05K 7/2039;
(Continued)

(56) References Cited

U.S. PATENT DOCUMENTS 2,561,738 A    7/1951   Hill
2,875,263 A    2/1959   Paul
(Continued)

FOREIGN PATENT DOCUMENTS

CN    101857794    10/2010
CN    102820738    12/2012
(Continued)

OTHER PUBLICATIONS

"3M™ Novec™ 649 Engineered Fluid", Product Information Sheet, (2009), 4 pgs.
(Continued)

*Primary Examiner* — Jayprakash N Gandhi
*Assistant Examiner* — Matthew Sinclair Muir
(74) *Attorney, Agent, or Firm* — Schwegman Lundberg & Woessner, P.A.

(57) ABSTRACT

A two-phased liquid-cooled electrical power apparatus includes a plurality of cooling circuits that recirculate and transition respective engineered fluids between liquid and vapor states around closed-loop fluid paths to cool a plurality of devices. A portion of each fluid path is either integrated with or in thermal contact with its device. The engineered fluids are evaporated within the respective portions of the fluid paths to hold the operating temperatures at or near the respective and different phase transition temperatures. The cooling circuits may be used to maintain different operating temperatures of hollow primary and secondary winding coils in a power transformer, of parallel connect hollow winding excitation coils and a common magnetic core in an electrical reactor, of power semiconductor devices mounted on heat sink(s) in which the fluid paths are embedded or power semiconductor devices in which the respective fluid paths pass through the devices.

13 Claims, 12 Drawing Sheets

(52) U.S. Cl.
CPC ..... *H05K 7/20309* (2013.01); *H05K 7/20318* (2013.01); *H05K 7/20327* (2013.01); *H05K 7/2039* (2013.01); *H05K 7/209* (2013.01)

(58) Field of Classification Search
CPC .... H05K 7/209; H05K 7/20518; H01F 27/18; H01F 27/08; H01F 27/10; H01F 27/105; H01L 23/427
See application file for complete search history.

(56) References Cited

U.S. PATENT DOCUMENTS

| | | | |
|---|---|---|---|
| 2,961,476 | A | 11/1960 | Maslin et al. |
| 3,201,728 | A * | 8/1965 | McWhirter ......... H01F 27/2876 174/15.1 |
| 3,261,905 | A | 7/1966 | Allen |
| 3,626,080 | A | 12/1971 | Pierce |
| 3,887,759 | A | 6/1975 | Staub et al. |
| 4,011,535 | A | 3/1977 | Kosky et al. |
| 4,071,800 | A | 1/1978 | Atkins |
| 4,078,149 | A | 3/1978 | Whirlow et al. |
| 5,355,942 | A | 10/1994 | Conte |
| 7,005,840 | B2 * | 2/2006 | Cester ................ H02M 5/272 323/355 |
| 7,104,313 | B2 * | 9/2006 | Pokharna ............. H02K 44/04 257/E23.098 |
| 8,436,706 | B2 * | 5/2013 | Sathe .................... H01F 27/18 336/62 |
| 8,928,443 | B2 * | 1/2015 | Hyde .................... H01F 27/10 336/182 |
| 9,306,386 | B2 | 4/2016 | Kuznetsov |
| 9,307,914 | B2 | 4/2016 | Fahey |
| 9,531,247 | B2 | 12/2016 | Kuznetsov |
| 9,968,003 | B2 * | 5/2018 | Sakamoto ............ H01L 23/467 |
| 10,123,454 | B2 * | 11/2018 | Saito .................. H05K 7/20236 |
| 10,952,354 | B1 * | 3/2021 | Chen ..................... H01L 23/46 |
| 11,990,598 | B1 * | 5/2024 | Ahmad ............. H01M 10/613 |
| 2008/0122566 | A1 | 5/2008 | Tegart |
| 2015/0059388 | A1 * | 3/2015 | Hirano ............... H05K 7/20772 62/259.2 |
| 2017/0330663 | A1 * | 11/2017 | Bauer ....................... H01F 6/06 |
| 2019/0066899 | A1 * | 2/2019 | Sakamoto ............ H01F 27/10 |
| 2022/0171263 | A1 * | 6/2022 | Wu ......................... G03B 21/16 |
| 2022/0418161 | A1 * | 12/2022 | Gao ................... H05K 7/20327 |
| 2023/0217630 | A1 * | 7/2023 | Gao ................... H05K 7/20818 361/699 |
| 2024/0171044 | A1 | 5/2024 | Kuznetsov |

FOREIGN PATENT DOCUMENTS

| | | |
|---|---|---|
| CN | 103280928 | 9/2013 |
| DE | 3031421 | 2/1982 |
| EP | 2774853 | 9/2014 |
| GB | 991656 | 5/1965 |
| JP | 7029754 | 2/2022 |
| WO | 2024036163 | 2/2024 |
| WO | 2024112563 | 5/2024 |

OTHER PUBLICATIONS

"Dielectric Heat Transfer Fluid Solutions for Military and Aerospace Applications", 3M™ Thermal Management Fluids Brochure, (2008), 8 pgs.

"Galden® SV Fluids CFC-free Solvents for Safer Operations", Solvay Specialty Polymers Brochure Version 2.1, (2015), 2 pgs.

Forrest, Eric C., et al., "Pressure Effects On the Pool Boiling of the Fluorinated Ketone C2F5C(O)CF(CF3)2", 2010 12th IEEE Intersociety Conference on Thermal and Thermomechanical Phenomena in Electronic Systems, (2010), 1-9.

Moore, C.L., et al., "Design and Perforkpance Characteristics of Gas/Vapor Transformers", IEEE Transactions on Power Apparatus and Systems, vol. PAS-101, No. 7, (Jul. 1982), 2167-2170.

Moore, C.L., et al., "Recent Developments in Gas/Vapor and Fire Resistant Transformers", 7th IEEE/PES Transmission and Distribution Conference and Exposition, Apr. 1-6, 1979, (1979), 9 pgs.

Narbut, Paul, et al., "Vaporization Cooling for Power Transformers", Transactions of the American Institute of Electrical Engineers. Part III: Power Apparatus and Systems, vol. 78, No. 4, (Dec. 1959), 1319-1325.

Swart, S.M., et al., "Integrated Water Cooled Transformer and Work Coil for Middle Frequency Induction Heating Applications", Conference Record of the 1993 IEEE Industry Applications Conference Twenty-Eighth IAS Annual Meeting, (1993), 1219-1225.

"International Application Serial No. PCT US2023 071860, International Search Report mailed Nov. 10, 2023", 5 pgs.

"International Application Serial No. PCT US2023 071860, Written Opinion mailed Nov. 10, 2023", 12 pgs.

"International Application Serial No. PCT US2023 080058, International Search Report mailed Mar. 18, 2024", 4 pgs.

"International Application Serial No. PCT US2023 080058, Written Opinion mailed Mar. 18, 2024", 10 pgs.

* cited by examiner

| | |
|---|---|
| OUTPUT POWER RATING | 3000 kVA/3000 kW |
| PRIMARY VOLTAGE | 4160 VOLTS, 3-PHASE, 60 Hz |
| SECONDARY VOLTAGE | 750 VOLTS, 6-PHASE, 60 Hz |
| PRIMARY LOSSES/ SECONDARY LOSSES | 25 kW/35 kW |
| WINDING CURRENT DENSITIES (PRI./SEC.) | 4.4 A/mm$^2$ & 7.9 A/mm$^2$ |
| PRIMARY TEMPERATURE RISE (INLET/OUTLET) | 15 °C (61 °C/76 °C) |
| SECONDARY TEMPERATURE RISE (INLET/OUTLET) | 25 °C (103 °C/128 °C) |
| PRIMARY COOLANT | NOVEC 7200 |
| SECONDARY COOLANT | NOVEC 7500 |
| EXTERNAL POWER TO OPERATE 2 EM PUMPS | 5 kW |
| COMBINED JOULE LOSS + PUMP POWER | 65 kW, OVERALL EFFICIENCY = 97.9% |
| OVERALL DIMENSIONS (DIAMETER/HEIGHT) | 0.890 m/0.457 m |

FIG. 7A

| | UNIT | NOVEC 7000 | NOVEC 7100 | NOVEC 7200 | NOVEC 7300 | NOVEC 7500 | NOVEC 7600 |
|---|---|---|---|---|---|---|---|
| BOILING POINT | °C | 34 | 61 | 76 | 98 | 128 | 131 |
| VAPOR PRESSURE | kPa | 65 | 27 | 16 | 5.9 | 2.1 | 0.96 |
| HEAT OF VAPORIZATION | kJ/kg | 142 | 112 | 119 | 102 | 89 | 116 |
| LIQUID DENSITY | kg/m$^3$ | 1400 | 1510 | 1420 | 1660 | 1614 | 1540 |
| SPECIFIC HEAT | J/kg-K | 1300 | 1183 | 1220 | 1140 | 1128 | 1319 |
| THERMAL CONDUCTIVITY | W/m-K | 0.075 | 0.069 | 0.068 | 0.063 | 0.065 | 0.071 |
| DIELECTRIC STRENGTH, 0.1" GAP | kV | 40 | 40 | 40 | 40 | 40 | 40 |

FIG. 7B

| | |
|---|---|
| REACTIVE POWER RATING | 100 kVAR |
| APPLIED EXCITATION VOLTAGE | 4160 VOLTS rms |
| DIELECTRIC WITHSTAND VOLTAGE RATING | 12 kV |
| FREQUENCY | 60 Hz |
| CURRENT RATING | 24.0 AMPS rms |
| WINDING CURRENT DENSITY | 7.0 A/mm$^2$ |
| ELECTRIC WINDING LOSS | 2 kW |
| CONDUCTOR ELECTRICAL CROSS SECTION/MATERIAL | 3.43 sq. mm/COOPER OFHC |
| PRIMARY COOLANT-ELECTRICAL HOLLOW CONDUCTORS | 3M COMPANY NOVEC 7200 |
| TRANSITION TEMPERATURE FOR NOVEC 7200 | 76 DEGREES C |
| OVERALL CORE WIDTH | 38.1 cm |
| MAGNETIC CORE DEPTH | 21.0 cm |
| MAGNETIC CORE HEIGHT | 27.0 cm |
| MAGNETIC STEEL TYPE | LAMINATED 29 GAUGE M-15 |
| MAGNETIC CORE HEAT SINK WIDTH/HEIGHT | 15.0 cm/2.0 cm PER SIDE |
| MAGNETIC CORE HEAT SINK MATERIAL | ALUMINUM 6061-T6 |
| MAGNETIC CORE COOLING TUBE DIAMETER | 0.80 cm |
| SECONDARY COOLANT FOR MAGNETIC CORE | 3M COMPANY NOVEC 649 |
| TRANSITION TEMPERATURE FOR NOVEC 649 | 49 DEGREES C |

FIG. 8B

TWO-PHASE LIQUID-COOLED ELECTRICAL POWER APPARATUS

BACKGROUND OF THE INVENTION

Field of the Invention

This invention relates to cooling systems for electrical or mechanical systems such as single or polyphase power transformers, electrical reactors, power semiconductor devices or the like and more particularly to the application of two-phase liquid-cooling using different engineered fluids such as fluoro-ketones (FKs), hydrofluoroethers (HFEs), perfluorocarbons (PFCs), hydrofluorocarbons (HFCs), perfluorohexans (PFHs), perfluoropolyether (PFPEs) and chlorofluorocarbons (CFCs) to optimize a thermal design in which different devices operate at different temperatures and heat loads.

DESCRIPTION OF THE RELATED ART

Electrical systems such as single or polyphase transformers, electrical reactors, power semiconductors or the like or mechanical systems such as bearings generate heat. Heat can degrade system performance, damage or reduce the lifetime of critical components or even start a fire.

Coolings systems are implemented to remove heat such that an operating temperature is at or below a specified temperature. The capacity of the cooling system is determined by the heat load and the specified operating temperature. Quite often the cooling system is driven by the worst case heat load or operating temperature within a system. Cooling systems require valuable space within a system, energy to remove the heat and add to the overall cost. Newer systems are producing greater amounts of heat in smaller volumes necessitating more efficient cooling systems.

There are a wide range of cooling systems that have been adapted to remove heat depending on system space, energy and cost requirements. A heat sink is a passive heat exchanger that transfers heat generated by a device to a fluid medium, often air or a liquid coolant, where it is dissipated away from the device. These may take the form of a "moving air" or a "recirculated immersive system". A related approach might be called a "recirculated integrated system" in which chilled water is recirculated directly through components such as hollow primary or secondary windings of a power transformer to absorb and remove heat. In each of these configurations, heat is transferred from a device to a fluid thereby raising its temperature and the fluid is extracted from the device.

Another approach known as "vaporization cooling" or "two-phase liquid-cooling" utilizes the phase transition of a fluid from a liquid phase to a vapor phase to accept heat. The primary benefit of this approach is that a liquid-to-vapor phase change at a fixed transition temperature has a far greater heat capacity or heat of vaporization than does heating the liquid. If properly configured, these systems may provide equal or greater cooling capacity than conventional systems while utilizing less space, less energy and at a lower cost. A simple example is spraying a liquid onto a heat sink such that the liquid vaporizes.

Vaporization cooling has been used quite extensively to cool the primary and secondary winding coils of a power transformer. Essentially the power transformer is placed in a sealed chamber in an upright orientation with electrical leads through the case for connection to the winding coils. A liquid such as a CFC or PFC is pumped to the top of the power transformer and than distributed in a thin layer over the primary and secondary winding coils such as by a system of spray heads. The primary and secondary winding coils are cooled by the evaporation of the liquid. The vapor is collected and condensed back to a liquid, which is recirculated to the top of the power transformer.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a two-phased liquid-cooled system in which a plurality of cooling circuits recirculate and transition engineered fluids between liquid and vapor states to cool a plurality of devices (and heated surfaces of those devices) and maintain different operating temperatures at or near the liquids' phase transition temperatures. The engineered fluids must be chemically inert, thermally stable, non-toxic, exhibit a high dielectric strength and preferably commercially available. Suitable engineered fluids are selected from fluorinated ketones (FKs), hydrofluoroethers (HFEs), perfluorocarbons (PFCs), hydrofluorocarbons (HFCs), perfluorohexans (PFHs), perfluoropolyether (PFPEs) and chlorofluorocarbons (CFCs) dependent upon the application.

In an embodiment, a two-phase liquid-cooled system comprises a pair of devices that generate heat at respective surfaces and operate at different operating temperatures. A pair of independent cooling circuits are configured to absorb the heat load and cool the respective devices. Each circuit includes a closed-loop fluid path in which an engineered liquid is recirculated and transitions between liquid and vapor states. A portion of the fluid path is either integrated with or in thermal contact with the surface of the device. The engineered liquid is evaporated at a phase transition temperature within the portion of the fluid path to cool the surface and hold the operating temperature at the surface at or near the first phase transition temperature. The engineered fluids in the cooling circuits exhibit different transition temperatures to accommodate different heat loads and operating temperatures of the different devices.

In an embodiment, each cooling circuit includes in the closed-loop fluid path a pump to recirculate the engineered liquid, a liquid pressure regulator to regulate a pressure of the engineered liquid, a vapor pressure regulator to regulate a pressure of the engineered liquid in its vapor state, and a condenser coupled to a chilled liquid reservoir to condense the engineered vapor into the engineered liquid for recirculation. The cooling circuits are suitably connected in series or parallel to a common chilled liquid (typically water) reservoir. Each cooling circuit may also include a vapor pressure sensor to sense and feedback the vapor pressure to the liquid pressure regulator to control the flow of the engineered liquid.

In an embodiment, at least one of the cooling circuits includes an additional device positioned upstream of the existing device. The engineered liquid flows through the fluid path to cool the additional device and hold its operating temperature at a temperature below that of the engineered liquid's phase transition temperature. In a particular embodiment, the devices are power semiconductor devices bonded to a common heat sink. A portion of the closed-loop fluid path is embedded in the common heat sink to liquid cool the upstream device and vapor cool the downstream device at a higher operating temperature.

In an embodiment, the engineered fluid is provided with a conductive solid granular media (e.g., aluminum shot). The pump includes an electro-magnetic pump (e.g., distributed AC induction coils) that generate a traveling magnetic field inside the closed-loop fluid path that interacts with the conductive solid granular media to produce a force to propel both the engineered fluid and media. The media also serves to increase the heat transfer capability of the engineered fluid and to more uniformly cool the portion of the fluid path in which vaporization occurs.

In an embodiment, the devices and their surfaces are hollow winding coils wound around a common magnetic core, which are energized to pass electrical current through the hollow winding coils thereby heating the coils. The engineered fluid(s) are evaporated inside the hollow winding coils.

In an embodiment, a power transformer includes single or polyphase primary (P) and secondary (S) hollow winding coils would around the common magnetic core. One of the cooling circuits recirculates a first engineered liquid through the single or polyphase P hollow winding coils to cool the coils and hold them at or near a transition temperature of the first engineered liquid. The other cooling circuit recirculates a second engineered liquid through the single or polyphase S hollow winding coils to cool the coils and hold them at or near a transition temperature of the second engineered liquid, which is higher than the transition temperature of the first engineered liquid. If a polyphase winding, each cooling circuit includes a liquid manifold to distribute the engineered liquid to the winding coils in parallel and a vapor manifold to collect the vapor from the polyphase coils. In a power transformer, the secondary winding coils typically operate at a higher current density and thus exhibit a greater heat load and higher operating temperature than the primary winding. The bifurcated cooling system can be optimized to provide the requisite heat load and operating different temperatures for both the P and S winding coils.

In another embodiment, an electrical reactor includes a plurality of hollow winding excitation coils wound around a common magnetic core. One of the cooling circuits recirculates a first engineered liquid in parallel through the hollow winding excitation coils where the liquid is vaporized to cool the excitation coils and hold them at or near the transition temperature of the first engineered liquid. The first engineered liquid is recirculated in parallel through the multiple excitation coils via a liquid manifold and a vapor manifold. A portion of the closed-loop fluid path of the other cooling circuit is embedded in a heat sink in thermal contact with the common magnetic core. Liquid/vapor manifolds may be used to cool multiple heat sinks attached to the common magnetic core. The second engineered liquid vaporizes within the heat sink to cool the common magnetic core and hold its operating temperature at or near the transition temperature of the second engineered fluid.

In another embodiment, in at least one of the cooling circuits the portion of the closed-loop path is embedded in a heat sink that is in thermal contact with the surface of the device.

In another embodiment, a pair of power semiconductor devices are thermally-bonded to a common heat sink and electrically isolated. The two devices operate at different p/n junction or semiconductor substrate temperatures. For example, one device may be a Silicon Controlled Rectifier (SCR) or thyristor and the other device may be a semiconductor switching device such as an integrated-gate-commutated-thyristor (IGCT) or a MOSFET. Thyristors have multiple p/n junctions that are actively cooled. A MOSFET is a field effect device (no p/n junction) in which case the semiconductor substrate is actively cooled. Each power semiconductor lies within the closed-loop fluid path of a different cooling circuit such that the engineered fluid is injected into the device, evaporates from direct contact with the p/n junction interface or the semiconductor substrate at the transition temperature and exits the device as vapor where it is condensed back to liquid and re-circulated.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 7A and 7B are Tables of design parameters for the two-phase liquid-cooled polyphase power transformer and parameters of different engineered fluorinated ketone fluids known as Novec™;

FIGS. 8A and 8B are a layout diagram of a two-phase liquid-cooled electrical reactor in which independent cooling circuits recirculate different PFCs through multiple hollow winding coils and a heat sink in thermal contact with the common magnetic core to maintain operating temperatures of the coils and magnetic core at different levels and a Table of design parameters for the electrical reactor;

DETAILED DESCRIPTION OF THE INVENTION

A two-phased liquid-cooled system includes two or more cooling circuits that recirculate and transition engineered fluids between liquid and vapor states to cool a plurality of devices (and heated surfaces of those devices) and maintain different operating temperatures at or near the liquids' phase transition temperatures. The engineered fluids must be chemically inert, thermally stable, non-toxic, exhibit a high dielectric strength and preferably commercially available. Suitable engineered fluids are selected from fluorinated ketones (FKs), hydrofluoroethers (HFEs), perfluorocarbons (PFCs), hydrofluorocarbons (HFCs), perfluorohexans (PFHs), perfluoropolyether (PFPEs) and chlorofluorocarbons (CFCs) dependent upon the application. For example, the cooling circuits may be used to maintain different operating temperatures of hollow primary and secondary winding coils in a power transformer, of parallel connect hollow winding excitation coils and a common magnetic core in an electrical reactor, of power semiconductor devices mounted on heat sink(s) in which the fluid paths are embedded or power semiconductor devices in which the respective fluid paths pass through the devices or mechanical systems such as bearings. 3M™ company manufactures a class of engineered fluids under the tradename Novec™ that are an example of a fluorinated ketone (FK) that exhibits the required properties for a wide variety of applications and is used in the embodiments described herein.

Figure 1:
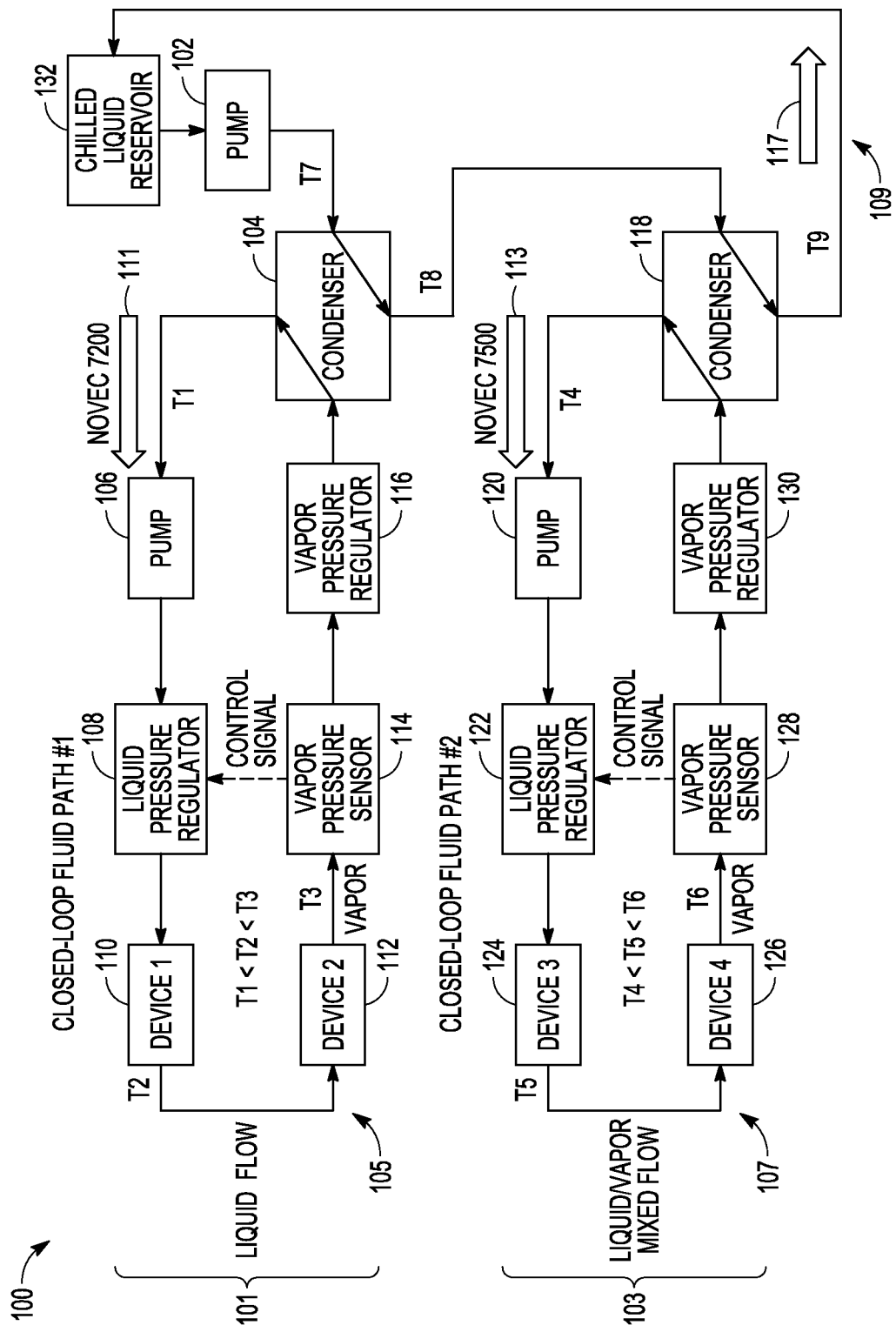
FIG. 1 is a layout diagram of an embodiment of a two-phase liquid-cooled system in which independent cooling circuits recirculate different engineered liquids in closed-loop fluid paths to liquid cool a first device and cool through a phase transition to a vapor a second device to optimize an overall thermal design for the system.

Referring now to FIG. 1, an embodiment of a two-phased liquid-cooled system 100 includes first and second cooling circuits 101 and 103 whose closed-loop fluid paths 105 and 107 are suitably connected to a common output cooling path 109 that includes condensers 104 and 118, a pump 102 and a chilled liquid reservoir 132 for recirculating chilled liquid 117 such as water. The closed loop fluid path 105 includes condenser 104, a liquid pump 106 having input temperature T1, a liquid pressure regulator 108, a first heat generating device 110 with output temperature T2 as a liquid, a second heat generating device 112 having output temperature T3 as a vapor, a vapor pressure sensor 114 suitably configured to measure the vapor pressure and provide a control signal to liquid pressure regulator 108 to control the flow, a vapor pressure regulator 116 to maintain the appropriate vapor pressure for a specific vapor transition temperature and a return path to condenser 104 to recirculate an engineered liquid 111 and transition the engineered liquid 111 between its liquid and vapor phases to cool the devices. It is understood that temperature T1 is less than temperature T2 which is less than temperature T3. The heat Q1 and Q2 generated by devices 110 and 112 is transferred to the chilled liquid reservoir 132 or similar cooling supply through the condenser 104 at inlet temperature T7 and outlet temperature T8 (T7<T1). A suitable two-phase liquid is 3M™ Company's Novec™ 7200 which has a transition temperature of 76° C. and a heat of vaporization of 119 kJ/kg can be used for the first cooling circuit. A representative first device 110 is a back-iron heat sink in an electrical reactor with relatively minor electrical power dissipation due to iron eddy current losses whereas a representative second device 112 is a hollow electrical winding coil in the same electrical reactor with a larger electrical power dissipation due to conductor joule losses. In this example, a first portion of closed-loop fluid path 105 is embedded in the heat sink (Device 1 110) and a second portion of closed-loop fluid path 105 is integrally formed with the hollow electrical winding coil (Device 2 112). Engineered liquid 111 passes through the heat sink in its liquid state and absorbs heat Q2 to cool the heat sink. The temperature of the liquid increases from T1 to T2 but remains a liquid. The engineered liquid 111 enters the hollow electrical winding coil in its liquid state where it absorbs sufficient heat Q2 to vaporize at least a portion of the liquid at vapor transition temperature T3 inside the winding coil thus maintaining the operating temperature of the winding coil at or near vapor transition temperature T3.

Closed-loop fluid path 107 is similarly configured to include condenser 118, a liquid pump 120 having input temperature T4, a liquid pressure regulator 122, a third heat generating device 124 with output temperature T5 as a liquid/vapor mix, a fourth heat generating device 126 having output temperature T6 as a vapor, a vapor pressure sensor 128, a vapor pressure regulator 130 suitably configured to measure the vapor pressure and provide a control signal to liquid pressure regulator 122 to control the flow and a return path to condenser 118 to recirculate an engineered liquid 113 and transition the engineered liquid 113 between its liquid and vapor phases to cool the devices. It is understood that temperature T4 is less than temperature T5 which is less than temperature T6. The heat Q3 and Q4 generated by devices 124 and 126 is transferred to the chilled liquid reservoir 132 or similar cooling supply through the condenser 118 at inlet temperature T8 and outlet temperature T9 (T7<T8<T9). A suitable two-phase fluid is 3M™ Company Novec™ 7600 which has a transition temperature of 128° C. and a heat of vaporization of 89 kJ/kg can be used for the second cooling circuit. A representative third device 124 is a hollow primary winding coil in an electrical transformer operating with dissipative electrical power only sufficient to vaporize fluid in contact with inner walls of the hollow conductor whereas a representative fourth device 126 is a hollow electrical winding coil in the same electrical transformer with larger electrical dissipative losses capable of vaporizing the entire liquid flow within the hollow conductor. In this example, a first portion of closed-loop fluid path 107 is integrally formed with the hollow primary winding coil (Device 1 124) and a second portion of closed-loop fluid path 107 is integrally formed with the hollow electrical winding coil (Device 2 126). Engineered liquid 113 passes through the hollow primary winding coil in its liquid state and absorbs heat Q2 to cool the heat sink. The temperature of the liquid increases from T4 to T5 sufficient to form a liquid/vapor mixed flow. The engineered liquid 113 enters the hollow electrical winding coil where it absorbs sufficient heat Q2 to further vaporize the mixed flow at vapor transition temperature T6 inside the winding coil thus maintaining the operating temperature of the winding coil at or near vapor transition temperature T6.

It is understood that chilled liquid reservoir 132 absorbs the total heat Q1+Q2+Q3+Q4 from all four devices, less a small amount of heat dissipated in the pump and tubing arrangement. A feature of this invention is that each of the four devices can be cooled at optimum design temperature close to a specific transition temperature particular to the design current density or heat dissipation of each component device rather than operating at a non-optimum common liquid-to-vapor transition temperature. The two representative fluids in use Novec™ 7200 and Novec™ 7500 with substantially different heat of vaporization energy levels and different transition temperatures is applicable in a common final fluid heat exchanger loop wherein each loop for Path 1 and Path 2 are arranged in a series connection. Alternately, the fluid paths could be connected in parallel to a common liquid reservoir or each connected to a dedicated liquid reservoir. The two-phase fluids have excellent electrical dielectric properties thereby providing electrical isolation amongst all four devices.

An important feature of the two-phase liquid-cooling system is that the closed-loop fluid paths allow for the system to be orientation independent. The system can be turned upside down, on its side or rock back-and-forth without affect cooling performance. This is very important for applications that may be mounted on moving land vehicles, ships or airborne vehicles. Many of the conventional cooling systems, and in-particular the ones that utilized vapor cooling required a stable upright orientation.

The closed-loop fluid paths also improve the coverage of the hot device surfaces that must be cooled. Spraying a liquid onto a hot surface or device inevitably leads to non-uniform coverage and missed spots whereas forcing the liquid through the surface or device provides uniform coverage of the entire surface, which results in more uniform cooling of the surface.

Figure 2:
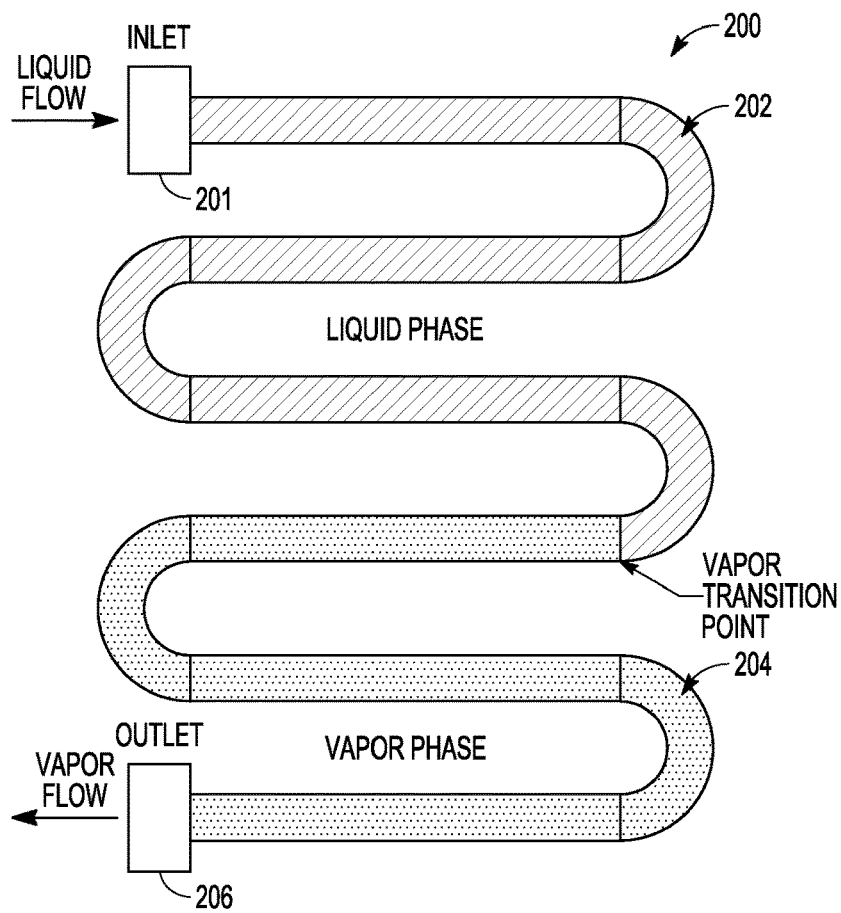
FIG. 2 is a diagram of a portion of a closed-loop fluid path in which an engineered liquid flows in its liquid phase absorbing heat and transitions to its vapor phase.

FIG. 2 shows an electrical hollow conductor 200 with an inlet manifold 201 and outlet manifold 206 whereby electrical current is injected or excited and an engineered liquid 202 is also transferred. Engineered liquid enters an inlet 201 and flows through the hollow conductor which is also an electrical metallic conductor such as forming a winding of an electrical reactor or transformer. At a distance along the conductor the accumulated heat exceeds the heat of vaporization (e.g., 119 kJ/kg if a 3M™ Company Novec™ 7200 is used) and the engineered liquid 202 transitions to a vapor 204 within the conductor at a vapor transition point and exits as a vapor at outlet 206. It is understood that the exact location of the vapor transition point will vary according to the actual electrical load and consequent electrical dissipative losses in the conductor. It is desirable from a design standpoint for the vapor transition point at maximum electrical dissipation to be within the last half of the hollow conductor's path. The singular conductor can be repeated multiple times with a primary or secondary winding structure to allow for multiple winding turns as is common practice whereby coils are both in electrical series connection and in electrical parallel connection.

Figure 3:
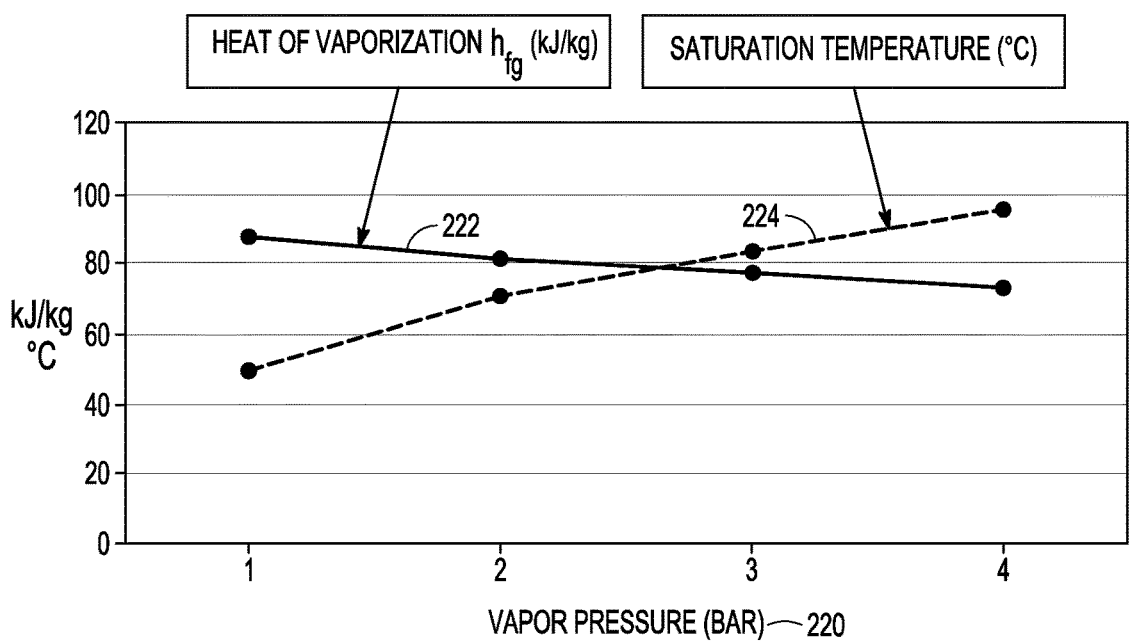
FIG. 3 is a plot of Saturation Temperature and Specific Energy vs. Vapor Pressure for a fluorinated ketone at saturation conditions.

There is also generated a vapor pressure 220 within the hollow conductor which is temperature dependent as shown in FIG. 3 indicating a vapor pressure range of 1-4 bars at a saturation temperature 222 of 49° C. to 96° C. respectively for a specific fluid Novec™ No. 649. FIG. 3 also indicates that heat of vaporization 224 falls to a minor extent as function of higher vapor pressures which is acceptable.

Figure 4A:
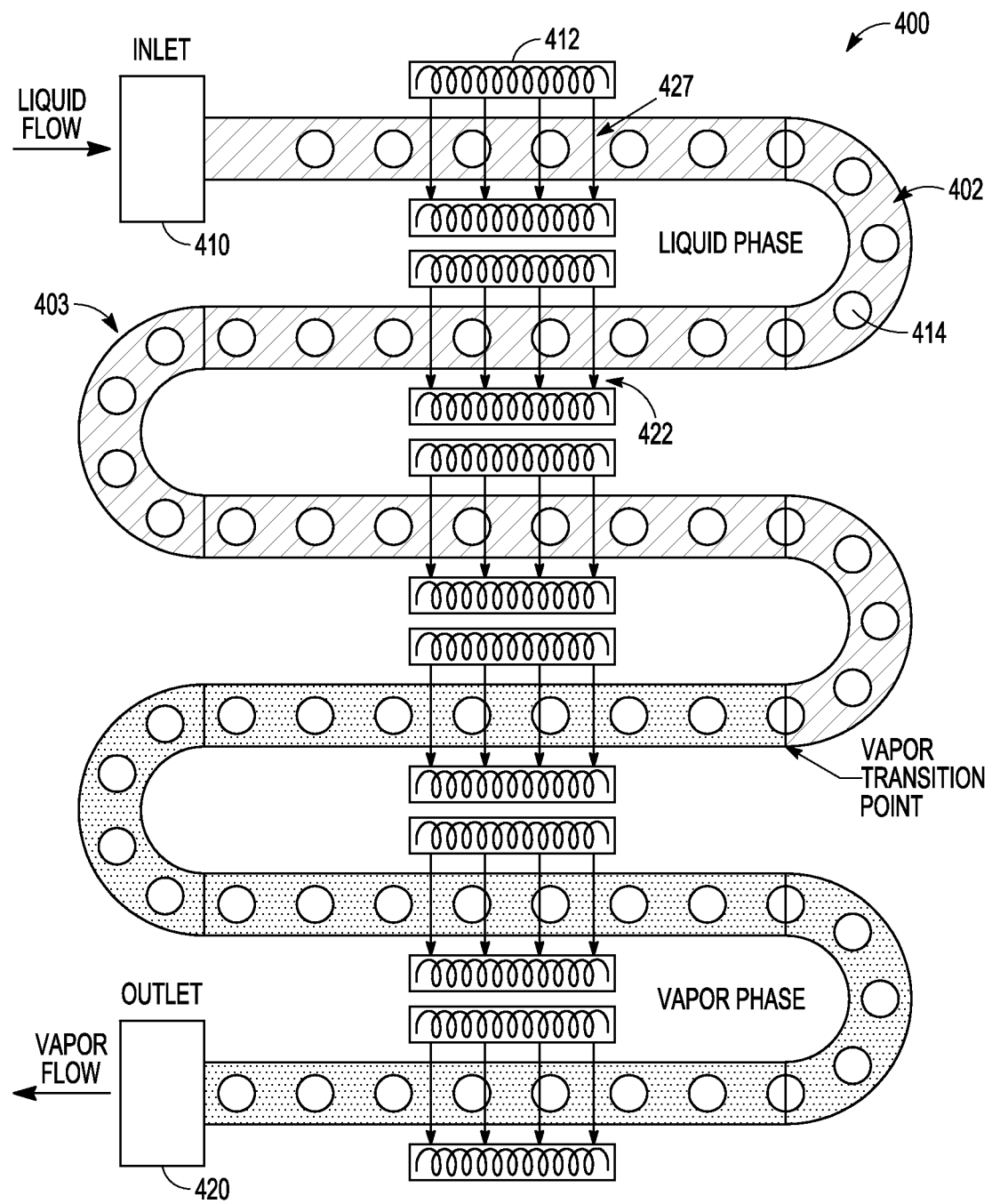
FIGS. 4A and 4B are diagrams of a portion of a closed-loop fluid path in which an engineered liquid including a conductive solid granular media flows in response to the interaction of traveling wave generated by distributed electro-magnetic pumps with the media in its liquid phase absorbing heat and transitions to its vapor phase.
Figure 4B:
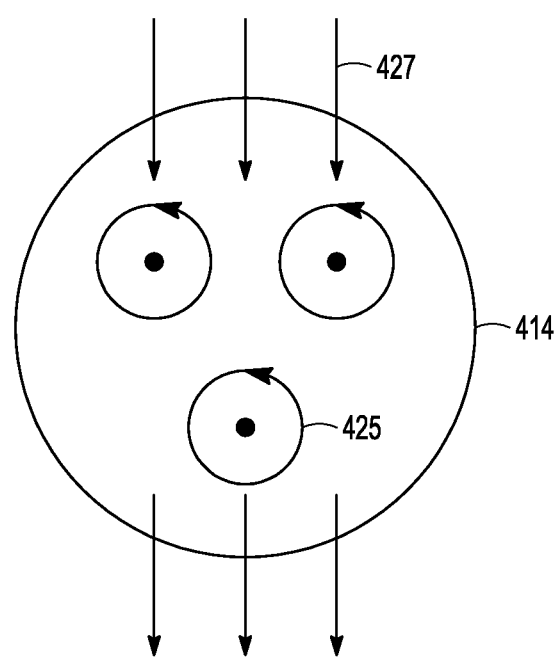

Referring now to FIG. 4A-4B, an embodiment of system of a two-phase liquid-cooled system 400 includes an engineered liquid 402 that is seeded with a conductive solid granular media 414 and introduced to a hollow electrical conductor 403 at an inlet 410, vaporized within the hollow electrical conductor, exhausted at outlet 420, condensed and recirculated. Media 414 increases the overall cooling capacity, improves the uniformity of cooling over the hollow electrical conductor 403 and may be used to propel the engineered liquid 402 around the fluid path. Media 414 is suitably both electrically and thermally conductive, a suitable material being aluminum or magnesium alloy, which are both lightweight and high thermal conductivity materials with ability to be formed preferably into small spherical balls or "shot". The media 414 is designed to accept heat content from the electrical hollow conductor but not to melt. The engineered liquid flow is seeded with the media 414 prior to entering the system 400 and this media continues throughout the system and exits at outlet 420. Media 414 accepts (and removes) heat in the first half of the hollow electrical conductor prior to vaporization thereby improving the distribution of heat acceptance and more uniformly cooling the conductor. The conductive media is small enough in size, for example 0.065 inch diameter, to pass through a liquid pump, vapor pressure sensor, liquid pressure sensor and condenser as described in FIG. 1, and be constantly recirculated. The extra heat content of the conductive media 414 can be efficiently transferred to the external chilled liquid reservoir in FIG. 1 through the condensers.

An electromagnetic pump 412 may be used to propel the media 414, and engineered liquid 402, through the hollow electrical conductor 403. The electromagnetic pump 412, such as a coaxial electromagnetic pump, induces a traveling magnetic wave through an airgap 422 between the walls of the hollow electrical conductor to create eddy currents 425 in media 414. The media 414 is propelled by the cross product of the induced eddy currents 425 from the electromagnetic pump's AC magnetic B-field 427 and the B-field strength as shown in FIG. 4B. In a preferred embodiment, the B-field within the hollow conductor can be a strength of 1.5 to 1.7 Tesla. The conductive media 414 absorbs heat from the electrical conductor which is first transferred to the fluid 402 at first portions of the coolant path. It is not essential that the electromagnetic pump be continuous and as shown in FIG. 4A the pump is segmented to allow for bends or curvature in the electrical hollow conductor along a practical winding.

If the electromagnetic pump 412 is of sufficient capacity and a sufficient quantity of conductive media 414 is employed as a primary transport means, then conventional type of mechanical liquid pumps 106 or 120 shown in FIG. 1 may be replaced exclusively by the electromagnetic pump 412. The vapor transition point within the hollow conductor preferably occurs within the last half of the overall flow path.

Figure 5:
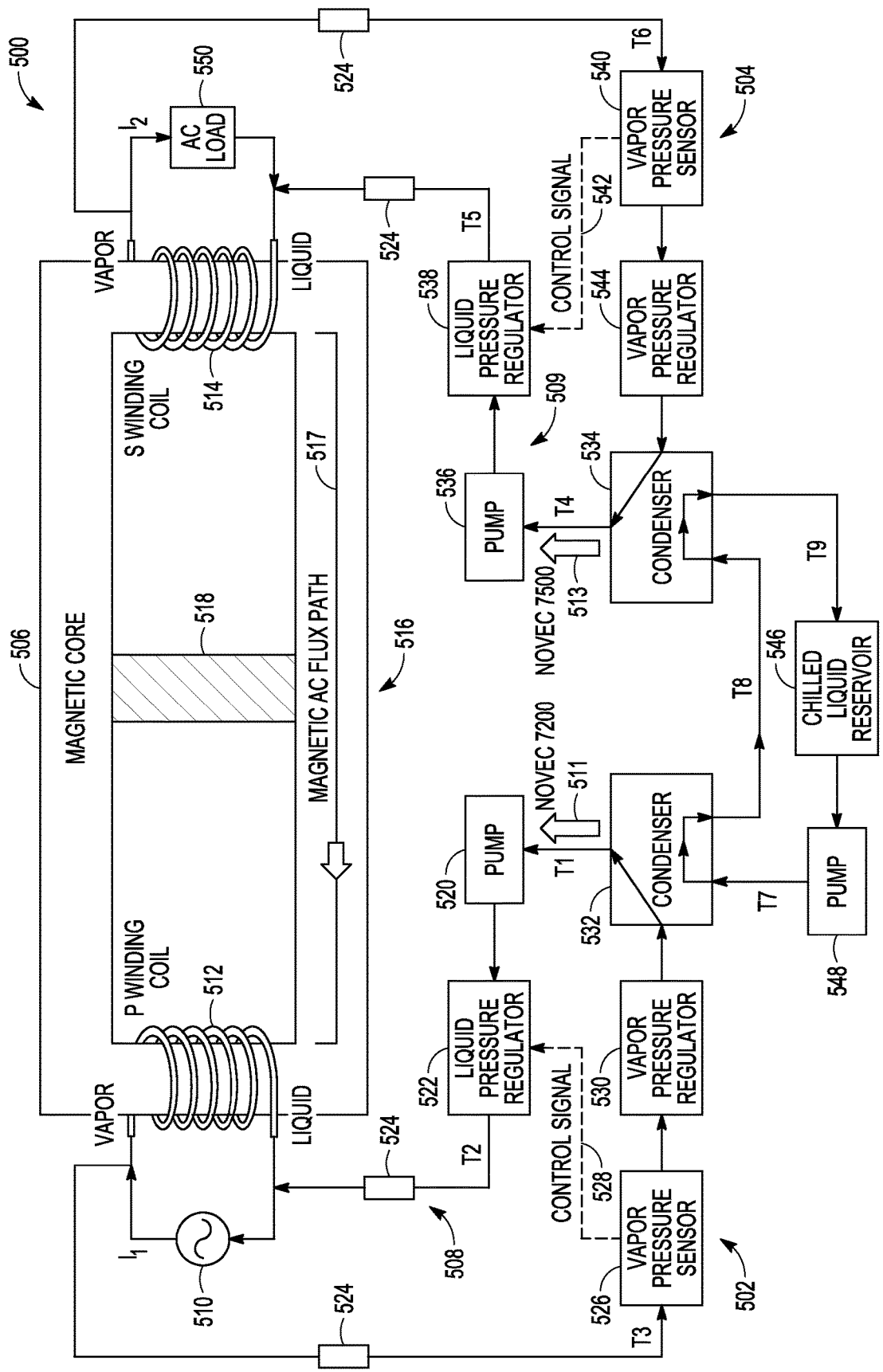
FIG. 5 is a layout diagram of an embodiment of a two-phase liquid-cooled single-phase power transformer in which independent cooling circuits recirculate different engineered liquids through single-phase hollow primary and secondary winding coils to maintain the operating temperatures of the coils at different levels.

Referring now to FIG. 5, an embodiment of a two-phase liquid-cooled single-phase transformer 500 includes first and second independent cooling circuits 502 and 504, respectively, which are interconnected through respective condensers 532 and 534 to impart combined heat to a chilled liquid reservoir 546 to independently cool and maintain desired operating temperatures for primary and secondary hollow winding coils 512 and 514, respectively, wound on a common magnetic core 506 to form a closed-magnetic circuit structure 516 with a magnetic AC flux path 517. Primary hollow winding coil 512 is fed from an AC single-phase power source 510. Secondary hollow winding coil 514 drives an electrical load 550 connected to its electrical terminals.

A pump 548 feeds chilled liquid to condenser 532 shared with cooling circuit 502 at an inlet temperature of T7 and an outlet temperature of T8 and then transfers chilled liquid to condenser 534 shared with cooling circuit 504 with an outlet temperature T9. The chilled liquid reservoir 546 absorbs the majority of heat generated by the primary and secondary hollow winding coils. The temperature differential T9-T7 combined with the flow rate determine the cooling capacity in Watts with a minor amount of heat dissipated in the tubing connecting the various components. In a preferred embodiment the chilled liquid is an ethylene-glycol-water mixture with an outlet temperature T7 in range of 10-15° C. and the pump 548 is a vane-type liquid pump containing a constant-pressure internal regulator.

The first cooling circuit 502 includes a closed-loop fluid path 508 that recirculates an engineered liquid 511 that transitions between its liquid and vapor phases to cool the primary hollow winding coil 512. Engineered liquid 511 enters the primary hollow winding coil 512 at temperature T2 as a liquid, removes joule loss heat generated by the excitation of the winding coil 512 that produces a phase change to a vapor inside the hollow conductor that exits that outlet at temperate T3, which is close to the boiling point (transition temperature) of the engineered liquid. The vapor is circulated in closed-loop fluid path 508 through a vapor pressure sensor 526, a vapor pressure regulator 530 and condenser 532, which lowers the engineered liquid temperature to T1 whereby the vapor is changed back to a liquid. A pump 520 ensures a constant flow of engineered liquid to a liquid pressure regulator 522 that has output temperature T2. The vapor pressure sensor 526 outputs a control signal that serves as a feedback control signal 528 to the liquid pressure regulator 522 to limit the liquid pressure to a value that is within the safe operating point for the hollow conductor possibly built with thin walls with limited bursting strength. A suitable engineered liquid is 3M™ Company Novec™ 649 which has a transition temperature of 49° C. and a heat of vaporization of 89 kJ/kg.

The second cooling circuit 504 includes a closed-loop fluid path 509 that recirculates an engineered liquid 513 that transition between its liquid and vapor phases to cool the secondary hollow winding coil 514. Engineered liquid 513 enters the secondary hollow winding coil 514 at temperature T5 as a liquid, removes joule loss heat generated by the excitation of the winding coil 514 that produces a phase change to a vapor inside the hollow conductor that exits that outlet at temperate T6, which is close to the boiling point (transition temperature) of the engineered liquid. The vapor is circulated in closed-loop fluid path 509 through a vapor pressure sensor 540, a vapor pressure regulator 544 and condenser 534 which lowers the coolant temperature to T4 whereby the vapor is changed back to a liquid. The pump 536 ensures a constant flow of engineered liquid 513 to a liquid pressure regulator 538 that has output temperature T5. The vapor pressure sensor 540 outputs a control signal 542 serves as a feedback control signal to the liquid pressure regulator 538 to limit the liquid pressure to a value that is within the safe operating point for the hollow conductor possibly built with thin walls. A suitable fluid for the secondary coolant path is 3M™ Company Novec™ 7500 which has a transition temperature of 128° C. and a heat of vaporization of 89 kJ/kg.

It is clear the heat dissipated by secondary winding 514 results in a higher temperature rise and higher boiling point than heat dissipated by the primary winding 512. Further there is, in a preferred embodiment, a heat barrier 518 between the primary and secondary windings. The heat barrier may be a fiberglass-epoxy material or mica. It is important feature of this invention that the temperature differential between the two engineered liquid boiling points is significant at 128° C.-49° C. or 79° C. For the particular coolants chosen, the primary winding 512 is a high voltage winding with extra dielectric insulation and has a lower electrical current density e.g., 5.0 A/mm² than the secondary winding 514 current density which may be at 9.0 A/mm², hence lower resistive or joule loss for primary winding 512 which allows use of an engineered fluid with a lower boiling point for the primary winding 512. The system 500 includes four electrical inline insulators 524 which serve to provide electrical isolation so that exciting current or load currents do not flow into any metallic conductors composing the coolant tubing going to or from the liquid pressure regulators 522, 538 and vapor sensors 526, 540.

Figure 6A:
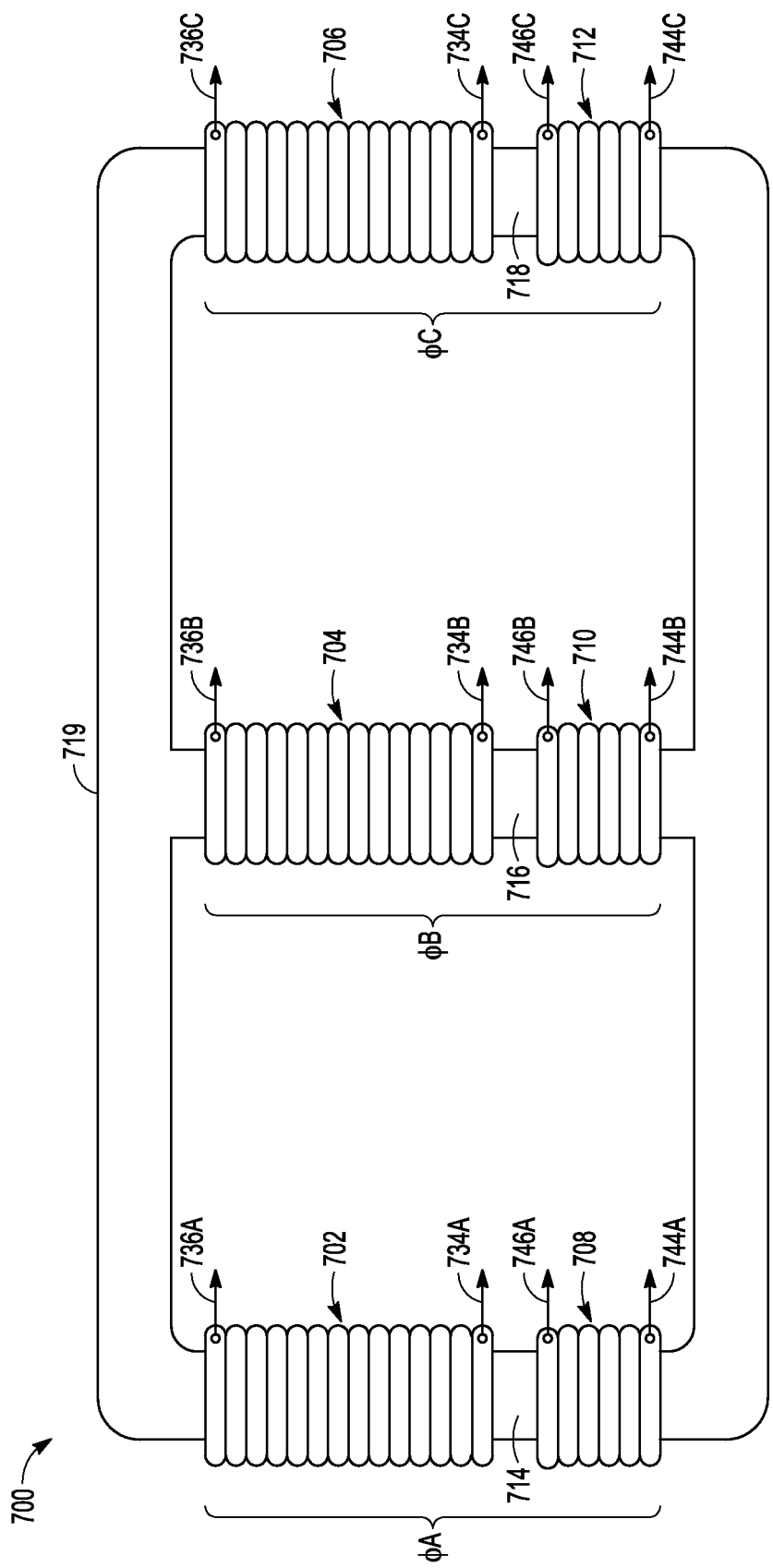
FIGS. 6A and 6B are side and top views of an embodiment of a two-phase liquid-cooled polyphase power transformer in which independent cooling circuits recirculate different engineered liquids through polyphase hollow primary and secondary winding coils to maintain the operating temperatures of the polyphase hollow primary and secondary coils at different levels.
Figure 6B:
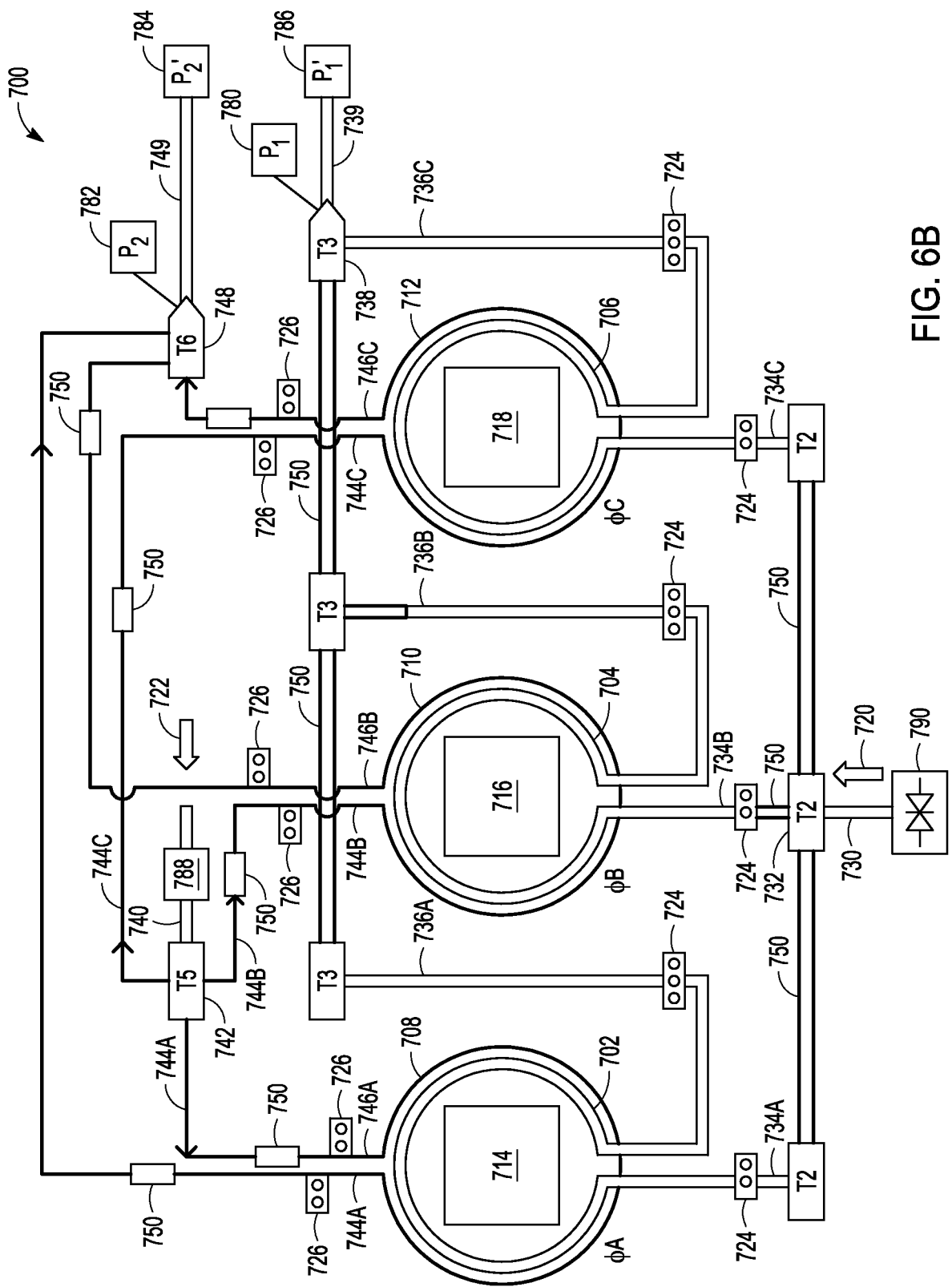

Referring now to FIGS. 6A and 6B, an embodiment of a two-phase liquid-cooled three-phase power transformer 700 includes three primary hollow winding coils 702, 704, 706 and three secondary hollow winding coils 708, 710, 712 wound in pairs in a coaxial fashion around the three legs 714, 716, 718 of a magnetic core 719. The primary and secondary hollow winding coils are connected to an AC source and an AC load through primary and secondary winding connections 724 and 726, respectively. The ampere-turns of the primary and secondary coils are nearly equal but due to the smaller volume allocated to the secondary, it will operate at a higher average temperature than the primary. Consequently, the primary hollow winding coils can circulate an engineered liquid at a lower boiling temperature than a different engineered liquid circulating in the secondary hollow winding coils.

Manifolds are implemented to separate different engineered liquids 720 and 722 into three parallel flows that feed the primary (secondary) hollow winding coils in parallel and collect the heat vapor from the primary (secondary) hollow winding coils. The manifolds lie within the closed loop-fluid paths of the cooling circuits such as described in FIG. 5 for a single-phase power transformer. The manifolds may be scaled to any polyphase implementation of N primary and M secondary hollow winding coils.

To service the primary hollow winding coils, a common primary inlet 730 feeds engineered liquid 720 as a liquid at temperature T2 to a primary inlet manifold 732, which separates the flow of engineered liquid 720 to three primary inlets 734a, 734b and 734c that are coupled one end of the three primary hollow winding coils 702, 704 and 706, respectively. Engineered liquid 720 is vaporized in each of the primary hollow winding coils and exhausted at the other end of the coils, which are coupled to three primary outlets 736a, 736b and 736c, which is than collected by a primary outlet manifold 738 and output as a vapor flow at temperature T3 at common primary outlet 739.

To service the secondary hollow winding coils, a common primary inlet 740 feeds engineered liquid 722 as a liquid at temperature T5 to a primary inlet manifold 742, which separates the flow of engineered liquid 722 to three primary inlets 744a, 744b and 744c that are coupled one end of the three secondary hollow winding coils 708, 710 and 712, respectively. Engineered liquid 722 is vaporized in each of the secondary hollow winding coils and exhausted at the other end of the coils, which are coupled to three primary outlets 746a, 746b and 746c, which is than collected by a primary outlet manifold 748 and output as a vapor flow at temperature T6 at common primary outlet 749.

Electrical insulators 750 isolate the primary and secondary circuits from one another and avoid circulating currents in the manifolds; these electrical insulators may be composed of hollow tubes of fiberglass epoxy material in line with the electrical hollow conductors carrying either liquid or vapor. The system includes vapor pressure regulators 784, 786 and two vapor pressure sensors 780, 782 that provide feedback signals to liquid pressure regulators 788, 790 feeding inlet manifolds 732 and 742.

FIG. 7A is a Table 790 of design parameters for a 3000 kVA 3-phase two-phase liquid-cooled power transformer with a 4160 Volt primary and a low-voltage secondary in which the unit has a higher current density on the secondary winding than the primary. The Table shows a reduction to practice with two distinct engineered fluids which have widely different boiling points of 76° C. and 128° C. to suit the primary and secondary windings with hollow conductors respectively. FIG. 7B is a Table 792 of 3M™ Novec™ engineered fluids indicating different boiling/transition temperatures and associated principal design parameters.

Figure 8A:
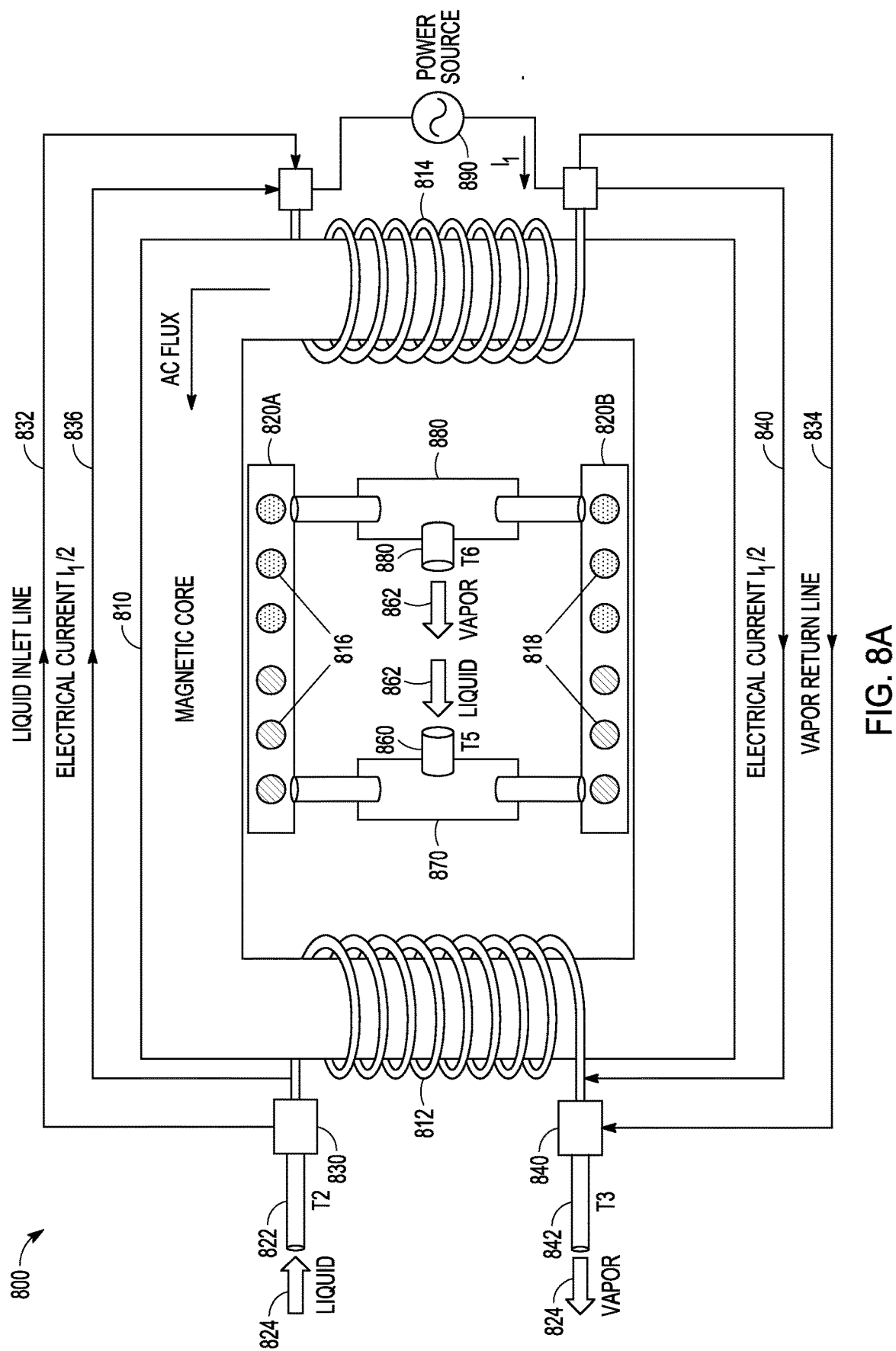

Referring now to FIGS. 8A and 8B, an embodiment of a two-phase liquid-cooled single-phase electrical reactor 800 in which a pair of hollow electrical winding coils 812 and 814 are distributed equally on opposite sides of a common magnetic core 810. The coils 812 and 814 are electrically connected in parallel via electrical cables 836 and 840. An AC power source 890 is connected across hollow electric winding coil 814. A heat sink is segmented into a pair of thermally conductive blocks 820A and 820B in thermal contact with opposite sides of magnetic core 810. Table 801 provides design parameters for a 100 kVAR single-phase electrical reactor.

In a closed-loop fluid path of a first cooling circuit, a common liquid inlet 822 feeds an engineered liquid 824 as a liquid at temperature T2 to an inlet manifold 830, which separates the flow of engineered liquid 824 to hollow electric winding coil 812 and through liquid inlet line 832 to hollow electric winding coil 814. Engineered liquid 824 is vaporized in each of the hollow winding coils and exhausted at the other end of the coils 812 and 814, which are directly coupled and coupled through vapor return line 834 to an outlet manifold 840 that collects and condenses the vapor at a common vapor outlet 842 at temperature T3.

In a closed-loop fluid path of a second cooling circuit, a common liquid inlet 860 feeds an engineered liquid 862 as a liquid at temperature T5 to an inlet manifold 870, which separates the flow of engineered liquid 862 to hollow tubes or channels 816 and 818 embedded in the thermally conductive blocks 820A and 820B of the heat sink. Engineered liquid 862 is vaporized in each of the hollow tubes or channels and exhausted at the other end, which are coupled to an outlet manifold 880 that collects and condenses the vapor at a common vapor outlet 882 at temperature T6.

In a preferred embodiment, the boiling point of the second engineered fluid 862 that flows through the heat sink will be lower than the boiling point for first engineered fluid 824 in the hollow electrical winding coils 812, 814 since the core loss dissipation is typically much less than the electrical winding power loss.

Figure 9A:
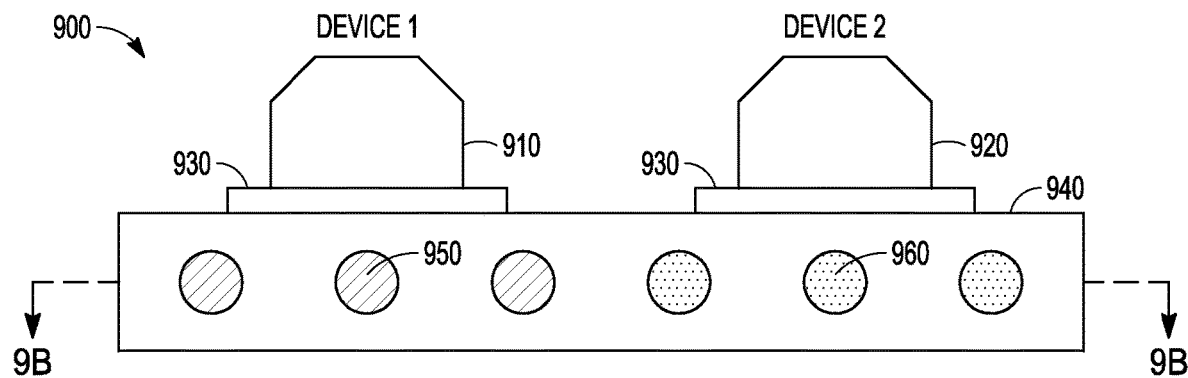
FIGS. 9A and 9B are side and section views of a cooling circuit in which a portion of the closed-loop fluid path is embedded in a heat sink that supports a pair of devices to liquid cool the first device and to cool through vaporization the second device.
Figure 9B:
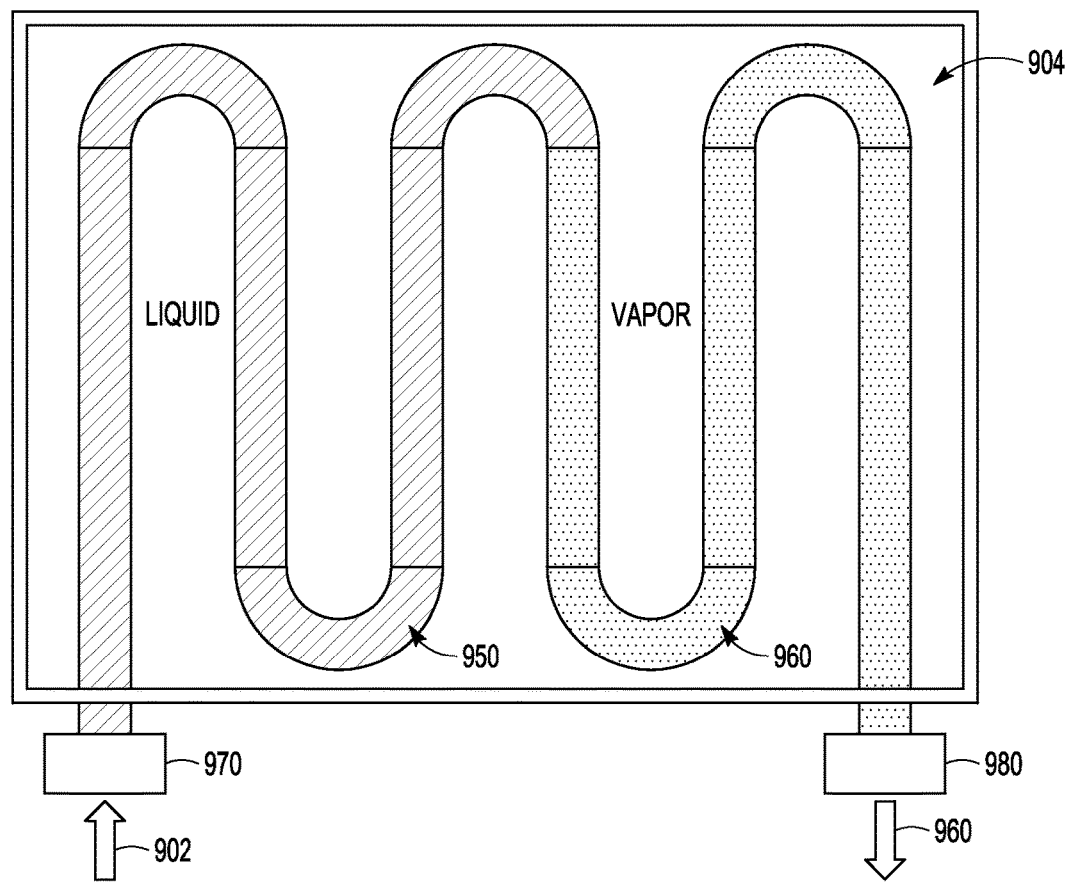

Referring now to FIGS. 9A and 9B, a two-phase liquid-cooled system 900 includes first and second devices (mechanical or electrical) 910 and 920 that are mounted on a solid substrate or thermal base 940 with use of optional thermal pads 930 to ensure low thermal resistance between mating surfaces. There is only one engineered liquid 902 in use and only one cooling circuit shown. However, the inlet manifold 970 and outlet manifold 980 can be machined to allow connection points to multiple or parallel paths of the cooling circuit. The solid substrate 940 contains an array of hollow tubes or channels 904 embedded therein that form a portion of a closed-loop fluid path to circulate the engineered liquid 902 and transfer heat from both devices 910, 920. A phase transition occurs within the tubes embedded in substrate 940. The system 900 allows the two devices 910, 920 to dissipate equivalent heats or to have widely different heat dissipation. For example, the engineered liquid 902 enters the substrate as a liquid 950 at temperature T1, accepts heat Q1 from Device 1 raising the temperature of the liquid to T2, accepts additional heat Q2 from Device 2 inducing a phase transition to vapor 960 at temperature T3. This is a simple, compact and efficient design of a heat sink to cool devices that may operate at different temperatures or similar temperatures but drastically different heat dissipation requirements. For example, Device 1 may operate at a lower temperature than Device 2 or Device 1 may operate at a similar temperature but require far less heat dissipation to do so.

Figure 10:
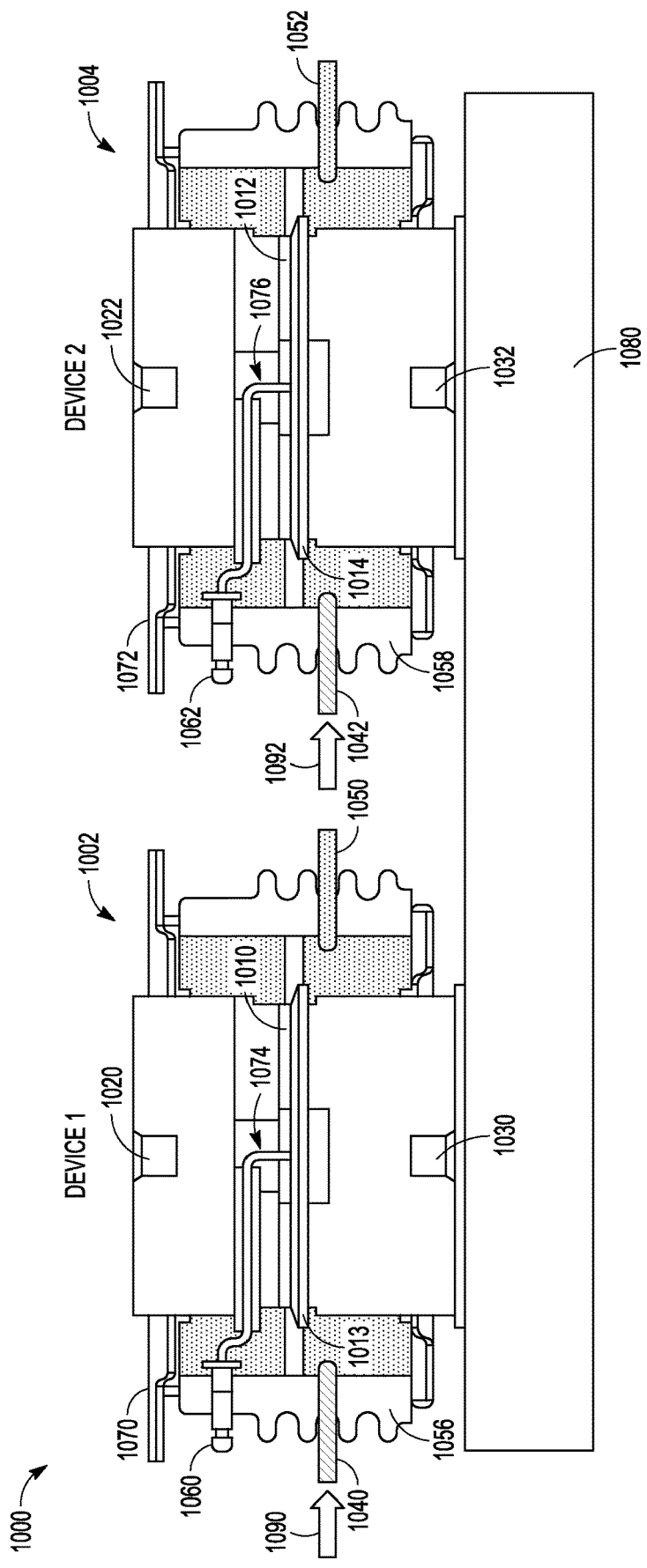
FIG. 10 is a side view of a pair of power semiconductor devices on a common substrate in which different engineered liquids are injected into the devices and vaporized to hold the respective operating temperatures of the p/n junctions at different levels.

Referring now to FIG. 10, an embodiment of a two-phase liquid-cooled system 1000 recirculates different engineered fluids through power semiconductor devices 1002 and 1004 such that vaporization of the liquids provides for internal cooling of each device commensurate with its heat dissipation requirements and operating temperature. For example, thyristors and insulated gate bipolar transistors (IGBTs) may have a different heat dissipation Q1 or Q2 due to widely different conduction current densities, different substrate material resistivities or different diameter/volume of substrate materials. Hence the need for engineered liquids with different transition temperatures and different heat capacities.

In this particular embodiment, thyristors 1002 and 1004 include device central semiconductor wafers 1010, 1012 with cathode materials 1020, 1022 and anode materials 1030, 1032, both of which are electrically and thermally conductive. The thyristors 1002 and 1004 have a cathode lead 1070, 1072, a triggered P-N-P-N junction semiconductor 1074, 1076 and a gate lead 1060, 1062 for controlling the thyristors. Each device is encapsulated in a ceramic shell 1056, 1058 that creates a void space around the semiconductor wafers. The majority of heat generated Q1 and Q2 is conducted through thyristor substrate 1013, 1014 and hence to anodes 1030, 1032, which are electrically connected to a common mounting base 1080 that has a limited thermal capacity as a heat sink. Some heat is conducting through the cathode 1020, 1022 and the void space to the ceramic shell for removal through ambient air. These heat sinking mechanisms may be inadequate to remove the heat and maintain desired operating temperatures or alternatively may have to be designed for the "worst case" device having the maximum heat dissipation requirements.

Accordingly, the thyristors are inserted into the closed-loop fluid paths of different cooling circuits that circulate different engineered liquids 1090, 1092 through the void spaces of thyristors 1002 and 1004 that evaporate from direct contact with the P-N-P-N junction semiconductors 1074, 1076 to extract heat from the devices. Engineered liquid 1090 is introduced as a liquid at port 1040 of thyristor 1002, flows around the semiconductor wafer 1010 and specifically the P-N-P-N junction semiconductor 1074 where it vaporizes at transition temperature T1 and is exhausted as vapor at port 1050. Similarly, engineered liquid 1092 is introduced as a liquid at port 1042 of thyristor 1004, flows around the semiconductor wafer 1012 and specifically the P-N-P-N junction semiconductor 1076 where it vaporizes at transition temperature T2 and is exhausted as vapor at port 1052.

Vapor outlet ports 1050, 1052 are individually connected to two or more different condensers to allow a repetitive transition of the vapor to a liquid state with a multiplicity of condensers. The two engineered liquids are kept in separate cooling circuits throughout. The condensers may have a heat exchange with external air flow or a closed-loop reservoir-pump system as shown in FIG. 1. The two engineered liquids may have widely different boiling points T1 and T2 to account for widely different heat dissipations within each device. In an alternate embodiment, the common mounting block 1080 may not be a thermally conductive material in which case the two cooling circuits extract the majority of device heat Q1 and Q2 for subsequent transfer of this heat to two condensers in an arrangement of FIG. 1. The system 1000 may be extended to a larger array of semiconductor devices allowing internal vapor cooling inside a multiplicity of semiconductor devices. The concept is valid for other types of power semiconductors such as MOSFETs which are field effect devices and have heat dissipation in p-type or n-type silicon or silicon-carbide substrates.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A two-phase liquid-cooled system, comprising:
   first and second devices that generate heat at first and second surfaces, respectively, by passing electrical current through the first and second surfaces, said first and second devices designed to operate at different first and second operating temperatures;
   a first cooling circuit including a first closed-loop fluid path in which a first engineered liquid selected from fluorinated ketones (FKs), hydrofluoroethers (HFEs), perfluorocarbons (PFCs), hydrofluorocarbons (HFCs), perfluorohexans (PFHs), perfluoropolyether (PFPEs) and chlorofluorocarbons (CFCs) is continuously recirculated, a first portion of the fluid path is integrated with the first surface inside the first device, wherein the first engineered liquid is recirculated over and absorbs sufficient heat directly from the first surface to evaporate at a first phase transition temperature within the first portion of the fluid path inside the first device to cool the first surface and hold the operating temperature at the first surface at or near the first phase transition temperature;
   a second cooling circuit including a second closed-loop fluid path in which a second engineered liquid selected from FKs, HFEs, PFCs, HFCs, PFHs, PFPEs and CFCs is recirculated, a second portion of the fluid path is integrated with the second surface inside the second device, wherein the second engineered liquid is continuously recirculated over and absorbs sufficient heat directly from the second surface to evaporate at a second phase transition temperature within the second portion of the fluid path inside the second device to cool the second surface and hold the operating temperature at the second surface at or near the second phase transition temperature;
   wherein said first and second engineered liquids exhibit different first and second phase transition temperatures and different heats of vaporization, wherein said second phase transition temperature is at least 30° C. higher than said first phase transition temperature;
   a heat barrier positioned between the first and second devices' first and second surfaces;
   first and second electrical inline insulators positioned in the first closed-loop fluid path on opposite sides of the first device;
   third and fourth electrical inline insulators positioned in the second closed-loop fluid path on opposite sides of the second device;
   wherein the first and second closed-loop fluid paths configure the two-phase liquid-cooled system to be orientation independent.

2. The system of claim 1, wherein the first surface and first portion of the closed-loop fluid path are integrated into a hollow winding coil wound around a magnetic core and energized to pass electrical current through the hollow winding coil, wherein the first engineered liquid is evaporated within the hollow winding coil to cool the hollow winding coil.

3. The system of claim 1, wherein the first and second devices comprise single or polyphase hollow primary and secondary winding coils, respectively, wound around a common magnetic core to form a power transformer, wherein the first and second engineered liquids are evaporated within the single or polyphase hollow primary and secondary winding coils, respectively, to cool the respective coils.

4. The system of claim 1, where said first device comprises a power semiconductor device positioned in the first closed-loop fluid path, wherein the first engineered liquid enters the power semiconductor device through an inlet, is evaporated from direct contact with a p/n junction or substrate of the power semiconductor device that forms the first surface and exits through an outlet as vapor.

5. The system of claim 1, further comprising a third device positioned in the first closed-loop fluid path upstream of the first device, wherein the first cooling circuit includes a third portion of the first closed-loop fluid path that is either integrated with or in thermal contact with a third surface of the third device, wherein the first engineered liquid cools the third surface and holds the operating temperature at the third surface at a temperature less than the first phase transition temperature.

6. The system of claim 5, wherein the first and third devices comprise power semiconductor devices bonded to a common heat sink, wherein third and first portions of the closed-loop fluid path are embedded in the common heat sink to liquid cool the third power semiconductor device and to vapor cool the first power semiconductor device.

7. The system of claim 1, wherein the first and second cooling circuits each include a pump to recirculate the engineered liquid, a liquid pressure regulator to regulate a pressure of the engineered liquid, a vapor pressure sensor configured to sense a pressure of the an engineered liquid vapor and output a control signal that serves as a feedback control signal to the liquid pressure regulator to limit the liquid pressure, a vapor pressure regulator to regulate a the pressure of an engineered vapor, and a condenser to condense the engineered vapor into the engineered liquid for recirculation, wherein the condensers in the first and second cooling circuits are connected in a loop with a pump and a common chilled liquid reservoir to feed chilled liquid through the condenser for the first device and then through the condenser for the second device before returning warmed liquid to the chilled liquid reservoir.

8. The system of claim 7, wherein the first engineered fluid comprises a conductive solid granular media, wherein the pump comprises an electro-magnetic pump that generates a traveling magnetic field inside the first closed-loop fluid path that interacts with the conductive solid granular media to produce an electrodynamic force to propel the engineered fluid and the conductive solid granular media, wherein the conductive solid granular media increases heat transfer from the first surface prior to vaporization of the first engineered liquid to more uniformly cool the first surface.

9. The system of claim 1, wherein the first engineered fluid comprises a conductive solid granular media, further comprising an electro-magnetic pump that generates a traveling magnetic field inside the first closed-loop fluid path that interacts with the conductive solid granular media to produce an electrodynamic force to propel the engineered fluid and conductive solid granular media, wherein the conductive solid granular media increases heat transfer from the first surface prior to vaporization of the first engineered liquid to more uniformly cool the first surface.

10. A two-phase liquid-cooled system, comprising:
a power transformer including single or polyphase hollow primary and secondary winding coils wound around a common magnetic core, wherein said coils are energized to pass electrical current through the coils and produce heat;
a first cooling circuit including a first closed-loop fluid path in which a first engineered liquid selected from fluorinated ketones (FKs), hydrofluoroethers (HFEs), perfluorocarbons (PFCs), hydrofluorocarbons (HFCs), perfluorohexans (PFHs), perfluoropolyether (PFPEs) and chlorofluorocarbons (CFCs) is continuously recirculated through the single or polyphase hollow primary winding coil and is evaporated at a first phase transition temperature T1 within the coil to cool the coil and hold the operating temperature of the coil at or near the first phase transition temperature T1; and
a second cooling circuit including a second closed-loop fluid path in which a second engineered liquid selected from FKs, HFEs, PFCs, HFCs, PFHs, PFPEs and CFCs is continuously recirculated through the single or polyphase hollow secondary winding coil and is evaporated at a second phase transition temperature T2 within the coil to cool the coil and hold the operating temperature of the coil at or near the second phase transition temperature T2>T1+30° C.;
a heat barrier positioned between the primary winding and the secondary winding;
first and second electrical inline insulators positioned in the first closed-loop fluid path on opposite sides of the primary winding coil;
third and fourth electrical inline insulators positioned in the second closed-loop fluid path on opposite sides of the secondary winding coil;
wherein the first and second closed-loop fluid paths configure the two-phase liquid-cooled system to be orientation independent.

11. The system of claim 10, wherein the first and second cooling circuits each include a pump to recirculate the engineered liquid a liquid pressure regulator to regulate a pressure of the engineered liquid, a vapor pressure sensor configured to sense a pressure of the an engineered liquid vapor and output a control signal that serves as a feedback control signal to the liquid pressure regulator to limit the liquid pressure within the primary or secondary winding coil, a vapor pressure regulator to regulate the pressure of an engineered liquid vapor, and a condenser to condense the engineered vapor into the engineered liquid for recirculation, wherein the condensers in the first and second cooling circuits are connected in a loop with a pump and a common chilled liquid reservoir to feed chilled liquid through the condenser for the primary winding coil and then through the condenser for the secondary winding coil before returning warmed liquid to the chilled liquid reservoir.

12. The system of claim 10, wherein each engineered fluid comprises a conductive solid granular media, the first and second cooling circuits each comprising an electro-magnetic pump that generates a traveling magnetic field inside the closed-loop fluid path that interacts with the conductive solid granular media to produce an electrodynamic force to propel the engineered liquid and conductive solid granular media, wherein the conductive solid granular media increases heat transfer from the hollow primary or secondary winding coils prior to vaporization of the engineered liquid to more uniformly cool the coils.

13. The system of claim 10, wherein the hollow primary and secondary winding coils are polyphase with a number N of winding coils and a number M winding coils, respectively,
wherein the first cooling circuit further includes a 1:N inlet manifold that distributes the first engineered liquid to flow through and vaporize within the N hollow primary winding coils in parallel and an N:1 outlet manifold that collects the vapor from the winding coils for condensation back to a liquid state for recirculation; and
wherein the second cooling circuit further includes a 1:M inlet manifold that distributes the second engineered liquid to flow through and vaporize within the M hollow secondary winding coils in parallel and an M:1 outlet manifold that collects the vapor from the winding coils for condensation back to a liquid state for recirculation.

* * * * *

UNITED STATES PATENT AND TRADEMARK OFFICE
CERTIFICATE OF CORRECTION

| | | |
|---|---|---|
| PATENT NO. | : 12,349,325 B2 | Page 1 of 1 |
| APPLICATION NO. | : 17/885400 | |
| DATED | : July 1, 2025 | |
| INVENTOR(S) | : Stephen B. Kuznetsov | |

It is certified that error appears in the above-identified patent and that said Letters Patent is hereby corrected as shown below:

On the Title Page

On page 2, in Column 2, item (56) under "Other Publications", Line 7, delete "C2F5C(O)CF(CF3)2"," and insert --$C_2F_5C(O)CF(CF_3)_2$",-- therefor On page 2, in Column 2, item (56) under "Other Publications", Line 10, delete "Perforkpance" and insert --Performance-- therefor In the Specification In Column 6, Line 44, delete "(Device 1" and insert --(Device 3-- therefor In Column 6, Line 47, delete "(Device 2" and insert --(Device 4-- therefor In Column 7, Line 50, delete "222" and insert --224-- therefor In Column 7, Line 52, delete "224" and insert --222-- therefor In Column 9, Line 12, delete "temperate" and insert --temperature-- therefor In Column 9, Line 36, delete "temperate" and insert --temperature-- therefor Signed and Sealed this
Tenth Day of February, 2026

John A. Squires
*Director of the United States Patent and Trademark Office*